United States Patent
Harvey

(10) Patent No.: US 10,466,854 B2
(45) Date of Patent: Nov. 5, 2019

(54) SYSTEMS AND METHODS FOR ACCESSING VISUALLY OBSCURED ELEMENTS OF A THREE-DIMENSIONAL MODEL

(71) Applicant: Hexagon Technology Center GmbH, Heerbrugg (CH)

(72) Inventor: Keith D. Harvey, Huntsville, AL (US)

(73) Assignee: Hexagon Technology Center GmbH, Heerbrugg (CH)

(*) Notice: Subject to any disclaimer, the term of this patent is extended or adjusted under 35 U.S.C. 154(b) by 279 days.

(21) Appl. No.: 15/179,477

(22) Filed: Jun. 10, 2016

(65) Prior Publication Data
US 2017/0357405 A1    Dec. 14, 2017

(51) Int. Cl.
| | | |
|---|---|---|
| G06F 3/0481 | (2013.01) | |
| G06F 3/0482 | (2013.01) | |
| G06F 3/0484 | (2013.01) | |
| G06F 3/0488 | (2013.01) | |
| G06F 17/50 | (2006.01) | |
| G06T 15/40 | (2011.01) | |
| G06T 19/20 | (2011.01) | |

(52) U.S. Cl.
CPC ........ G06F 3/04815 (2013.01); G06F 3/0482 (2013.01); G06F 3/04817 (2013.01); G06F 3/04842 (2013.01); G06F 3/04845 (2013.01); G06F 3/04883 (2013.01); G06F 17/50 (2013.01); G06T 15/40 (2013.01); G06T 19/20 (2013.01); *G06T 2219/2004* (2013.01)

(58) Field of Classification Search
CPC ............ G06F 3/04815; G06F 3/04817; G06F 3/0482; G06F 3/04842; G06F 3/04845; G06F 3/04883; G06F 17/50–5095; G06F 2217/00–86; G06T 15/40; G06T 19/00–006; G06T 19/20; G06T 2219/2004
See application file for complete search history.

(56) References Cited

U.S. PATENT DOCUMENTS

| | | | |
|---|---|---|---|
| 5,371,778 A | 12/1994 | Yanof et al. | |
| 5,602,564 A * | 2/1997 | Iwamura | G06F 3/04812 345/419 |
| 2002/0122038 A1* | 9/2002 | Cowperthwaite | G06T 15/40 345/428 |

(Continued)

OTHER PUBLICATIONS

Authorized Officer: Wiedmeyer, Vera, Notification of Transmittal of the International Search Report and the Written Opinion of the International Searching Authority, or the Declaration; PCT/US2017/035352, 15 pages, dated Aug. 17, 2017.

*Primary Examiner* — David S Posigian
(74) *Attorney, Agent, or Firm* — Nutter McClennen & Fish LLP

(57) ABSTRACT

A method provides access to visually obscured elements of a three-dimensional model on a screen of a computing device. The method displays, on the screen of the computing device, a view plane of the three-dimensional model showing at least one visible element. The at least one visible element at least partially obstructs at least one visually obstructed element of the three-dimensional model. The method also defines a region at a location on the screen associated with the at least one visible element of the three-dimensional model. In response to input relating to the region, the method superimposes a representation of the at least one visually obscured element over the view plane.

26 Claims, 18 Drawing Sheets

(56) References Cited

U.S. PATENT DOCUMENTS

| | | | | |
|---|---|---|---|---|
| 2005/0210444 A1* | 9/2005 | Gibson | G06F 17/50 | 717/108 |
| 2009/0094558 A1* | 4/2009 | Howard | G06F 17/30241 | 715/848 |
| 2010/0115455 A1* | 5/2010 | Kim | G06F 3/04815 | 715/781 |
| 2011/0007076 A1* | 1/2011 | Nielsen | G06F 17/30241 | 345/441 |
| 2011/0227919 A1* | 9/2011 | Bongio | G06T 19/20 | 345/426 |
| 2011/0273575 A1* | 11/2011 | Lee | G01C 21/20 | 348/222.1 |
| 2011/0296351 A1* | 12/2011 | Ewing, Jr. | G06F 3/0346 | 715/841 |
| 2012/0259436 A1* | 10/2012 | Resurreccion | G05B 23/0216 | 700/17 |
| 2013/0093756 A1* | 4/2013 | Davidson | G06F 3/04815 | 345/419 |
| 2013/0321269 A1* | 12/2013 | Beaurepaire | G01C 21/3682 | 345/158 |
| 2014/0245232 A1* | 8/2014 | Bailiang | G06F 3/04815 | 715/850 |
| 2015/0120251 A1* | 4/2015 | Kim | G06K 9/00201 | 703/1 |
| 2015/0130788 A1* | 5/2015 | Bailiang | G06T 15/10 | 345/419 |
| 2015/0186559 A1* | 7/2015 | Schmidt | G06F 17/5004 | 345/419 |
| 2015/0325049 A1* | 11/2015 | Feng | G06T 19/006 | 345/633 |

* cited by examiner

SYSTEMS AND METHODS FOR ACCESSING VISUALLY OBSCURED ELEMENTS OF A THREE-DIMENSIONAL MODEL

TECHNICAL FIELD

The present invention relates to accessing visually obscured elements of a three-dimensional model on a display device, and more particularly to systems and methods for providing such access with respect to a three-dimensional model created using computer-aided design (CAD).

BACKGROUND

Design, construction, and management of large-scale capital projects, such as process plants (e.g., oil refineries and pharmaceutical plants), power plants (e.g., a coal fueled power generation facility), ships (e.g., military shipping, cruise ships, or cargo ships), and off-shore oil platforms, requires coordination of processes and configuration data on a scale that is orders of magnitude greater than those of smaller, common projects (e.g., building and selling a ten room house). Large-scale capital projects consequently often require a substantially more comprehensive production and management solution.

In response to this need, those skilled in the art have developed comprehensive plant design programs (e.g., SmartPlant® Enterprise, distributed by Intergraph, Inc. of Huntsville, Ala.) that are specially configured for the rigors of such large capital projects. Among other things, this type of plant design program can be implemented as a broad application suite that manages most or all phases of a large-scale capital project, from initial conception, to design, construction, handover, maintenance, management, and decommissioning.

Plant design programs typically produce detailed 3D visualizations of their projects. Undesirably, such visualizations often have many components that are difficult to see on a relatively small monitor, such as a monitor on a tablet or other portable device.

SUMMARY OF THE EMBODIMENTS

In accordance with one embodiment of the invention, a method provides access to visually obscured elements of a three-dimensional model on a screen of a computing device. The method displays, on the screen of the computing device, a view plane of the three-dimensional model showing at least one visible element. The at least one visible element at least partially obstructs at least one visually obstructed element of the three-dimensional model. The method also defines a region at a location on the screen associated with the at least one visible element of the three-dimensional model. In response to input relating to the region, the method superimposes a representation of the at least one visually obscured element over the view plane.

In some embodiments, the at least one visually obscured element includes elements of the three-dimensional model that intersect with a volume defined by (1) the region, (2) the location on the screen, and (3) a vector that is orthogonal to the view plane.

Moreover, to superimpose the representation of the at least one visually obscured element, the method may display a representation of a first element that is visually obscured by the at least one visible element, and display a representation of a second element that is visually obscured by the first element. The method may display the representation of the first element after a duration of the input exceeds a threshold period of time; and display the representation of the second element after the duration of the input exceeds a second, successive threshold period of time. The method may further receive a second input at the location on the screen; and remove the representation of the second element from display after a duration of the second input exceeds the threshold period of time.

In various embodiments, to superimpose the representation of the at least one visually obscured element, the method displays the representation of the at least one visually obscured element in a linear or circular configuration.

The method may also receive a selection of a representation of a visually obscured element; receive an update to the location on the screen for the region; identify at least one visually obscured element that (1) is coupled to the selected element and (2) intersects a volume defined by the region, the updated location on the screen, and the vector that is orthogonal to the view plane; and superimpose a representation of the at least one identified element over the view plane. The at least one visually obscured element may be coupled to the selected element via an electrical or piping connection.

To superimpose the representation of the at least one visually obscured element, the method may display an icon indicating that an element is coupled to at least one other element in the three-dimensional model. The method may also receive a selection of the icon; and superimpose, on the view plane, at least one representation of an element coupled to the element associated with the icon.

In some embodiments, the method receives an instruction to adjust a location of the region; updates the at least one visually obscured element to include elements of the three-dimensional model that intersect with a volume defined by (1) the adjusted location of the region (2) the adjusted location on the screen and (3) a vector that is orthogonal to the view plane; and superimposes a representation of the at least one visually obscured element over the view plane. In other embodiments, the method may receive an instruction to adjust a size of the region; update the at least one visually obscured element to include elements of the three-dimensional model that intersect with a volume defined by (1) the adjusted region and (2) a vector that is orthogonal to the view plane; and superimpose a representation of the at least one visually obscured element over the view plane.

The method may also, in response to the input relating to the region, store a vector that is orthogonal to the view plane; receive an instruction from a user to change the orientation of the view plane of the three-dimensional model; and constrain the change to the view plane based on the stored vector.

The method may also receive a selection of a representation of a visually obscured element; and display a menu of functions available for application to the selected element. The menu of functions may include any one of viewing properties of the selected element, editing the selected element, deleting the selected element, and displaying elements that are related to the selected element. For this last function, the related elements may be electrical or piping connections.

In accordance with another embodiment of the invention, a mobile computing device is configured to provide access to visually obscured elements of a three-dimensional model. The device includes a touchscreen, a processor, and a memory that stores instructions that are executed by the processor. The touchscreen is configured to receive touch input from a user, the touchscreen configured to display a view plane of the three-dimensional model showing at least one visible element, the at least one visible element at least partially obstructing at least one visually obstructed element of the three-dimensional model. When the processor executes instructions stored in memory, the processor causes the mobile computing device to define a region at a location on the screen associated with the at least one visible element of the three-dimensional model; and in response to input relating to the region, superimpose a representation of the at least one visually obscured element over the view plane. The processor also executes instructions to cause the mobile computing device to perform any of the other functions described herein.

BRIEF DESCRIPTION OF THE DRAWINGS

The foregoing features of embodiments will be more readily understood by reference to the following detailed description, taken with reference to the accompanying drawings, in which.

DETAILED DESCRIPTION OF SPECIFIC EMBODIMENTS

Plant design programs have emerged as a useful tool in visualizing complex, three-dimensional (3D) structures. By selecting, positioning, and/or interrelating elements, a user can create a three-dimensional model (also referred to herein as "3D model"). The user may observe different view planes of the 3D model by panning, tilting, rotating, zooming, or otherwise manipulating the view of the model. Regardless, the user can observe only two-dimensional representations of the 3D model at any given time, and in any given view plane, only some of the elements are visible to the user; the remaining elements are partially or fully visually obscured.

To observe these obscured elements using conventional methods, a user must modify the orientation and position of the view plane to effectively zoom in and/or rotate about the 3D model until the elements of interest become visible. If the model is complex or dense, navigating the 3D model can be difficult. Furthermore, by changing the scale of the model in the view plane, the user may lose the context of the element within the model, either by losing perspective regarding the relationships between the element of interest and other elements of the model or the relationship between the element and the overall model. In other conventional methods, a user may apply filters to exclude elements that are obstructing the elements of interest from display. However, this approach requires the program to provide complex or extensive graphical user interfaces that the user manipulates to configure the filter to apply. When plant design programs or computer aided design (CAD) software is executed or output to mobile computing devices with screens of the limited sizes, displaying additional graphics to this extent may be undesirable.

The inventors solved these problems by developing systems and methods that superimpose representations of visually obscured elements on the view plane of the 3D model. In particular, illustrative embodiments of the invention use prescribed inputs from the user to identify/locate certain visually obscured elements of interest for display. The systems and methods then superimpose representations of the obscured elements on the view plane, and permit the user to select one or more of those superimposed elements for further investigation. In this manner, the user may access visually obscured elements of the 3D model without navigating the model itself in a cumbersome manner, as required by conventional systems.

Figure 2:
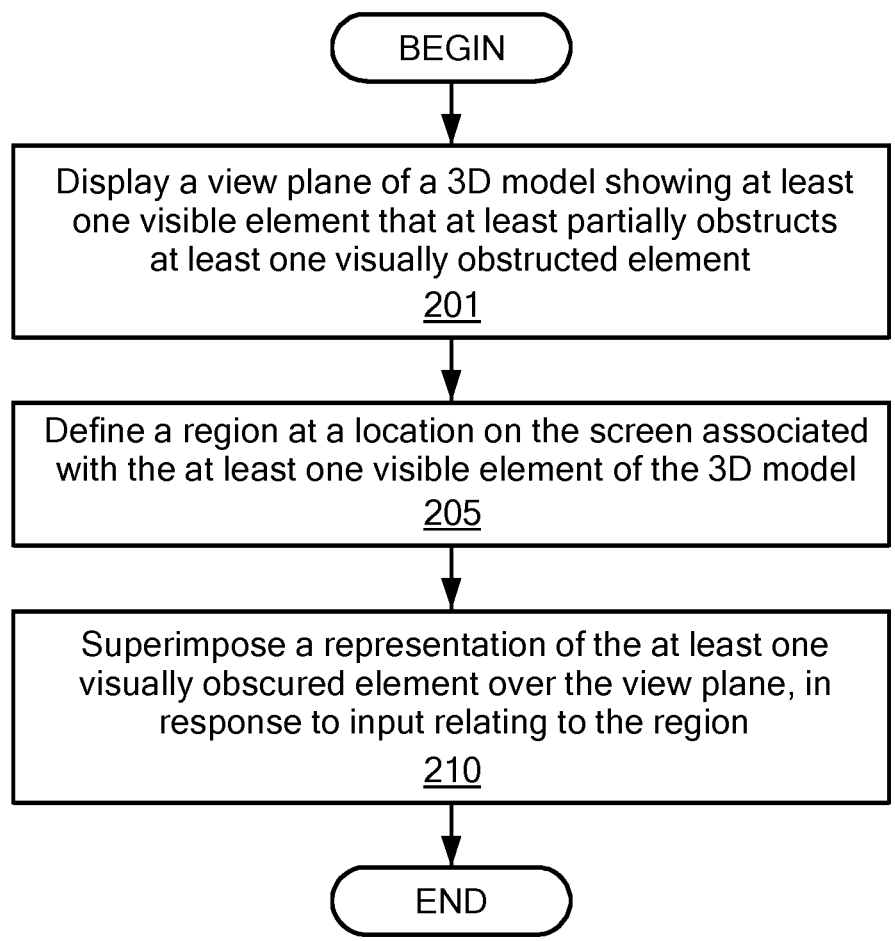
FIG. 2 depicts an exemplary method of providing access to visually obscured elements of a three-dimensional model on a screen of a computing device in accordance with illustrative embodiments of the invention.

To those ends, FIG. 2 shows a method of providing access to visually obscured elements of a three-dimensional model on a screen of a computing device in accordance with illustrative embodiments. The method may be implemented by the computing device itself, or a remote server in communication with the computing device (also referred to herein as the "system").

Figure 1A:
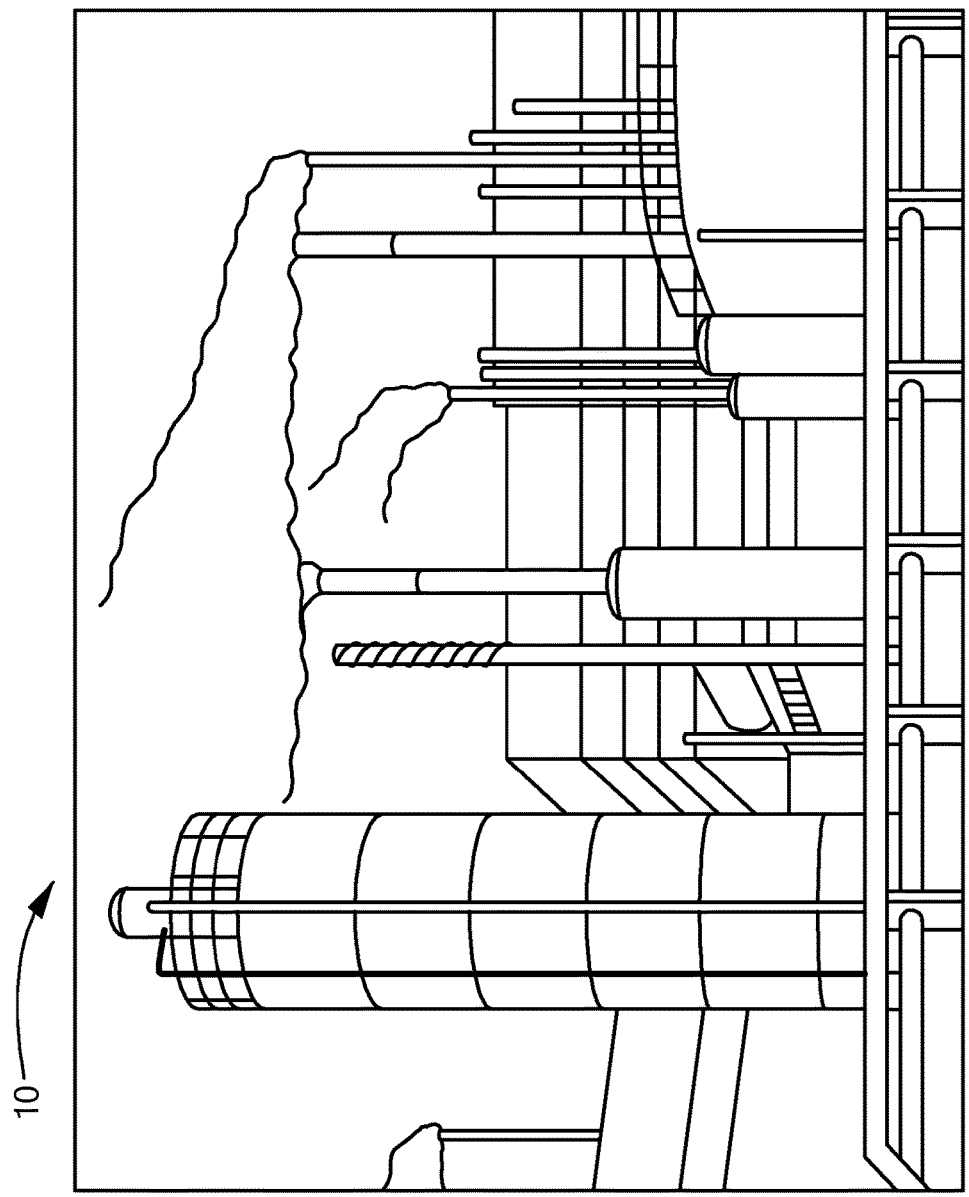
FIGS. 1A and 1B depict a part of a large-scale capital project and a part of a manufacturing project, respectively, that may be used in illustrative embodiments of the invention.

Illustrative embodiments may implement the method using a design program, such as a plant design program, a CAD program, or an Assembly design program. FIG. 1A (as well as other figures) generally shows a part of one example of a large-scale capital project 10 (more generally a "capital project 10") that may implement be used in illustrative embodiments of the invention. More specifically, as known by those skilled in the art, a capital project 10 generally is a long-term investment made to build, augment, add, or improve on a highly capital intensive project—it requires notable amounts of both financial capital and labor capital to undertake, and often takes years to complete. Capital projects 10 are often defined by their large-scale cost relative to other investments requiring less planning and resources (e.g., building a house or a truck). Both the private sector and public sector can be involved in a capital project 10. Some examples of capital projects 10 include developing and maintaining oil refineries, power plants, ships, offshore oil platforms, dams, and factories.

Figure 1B:
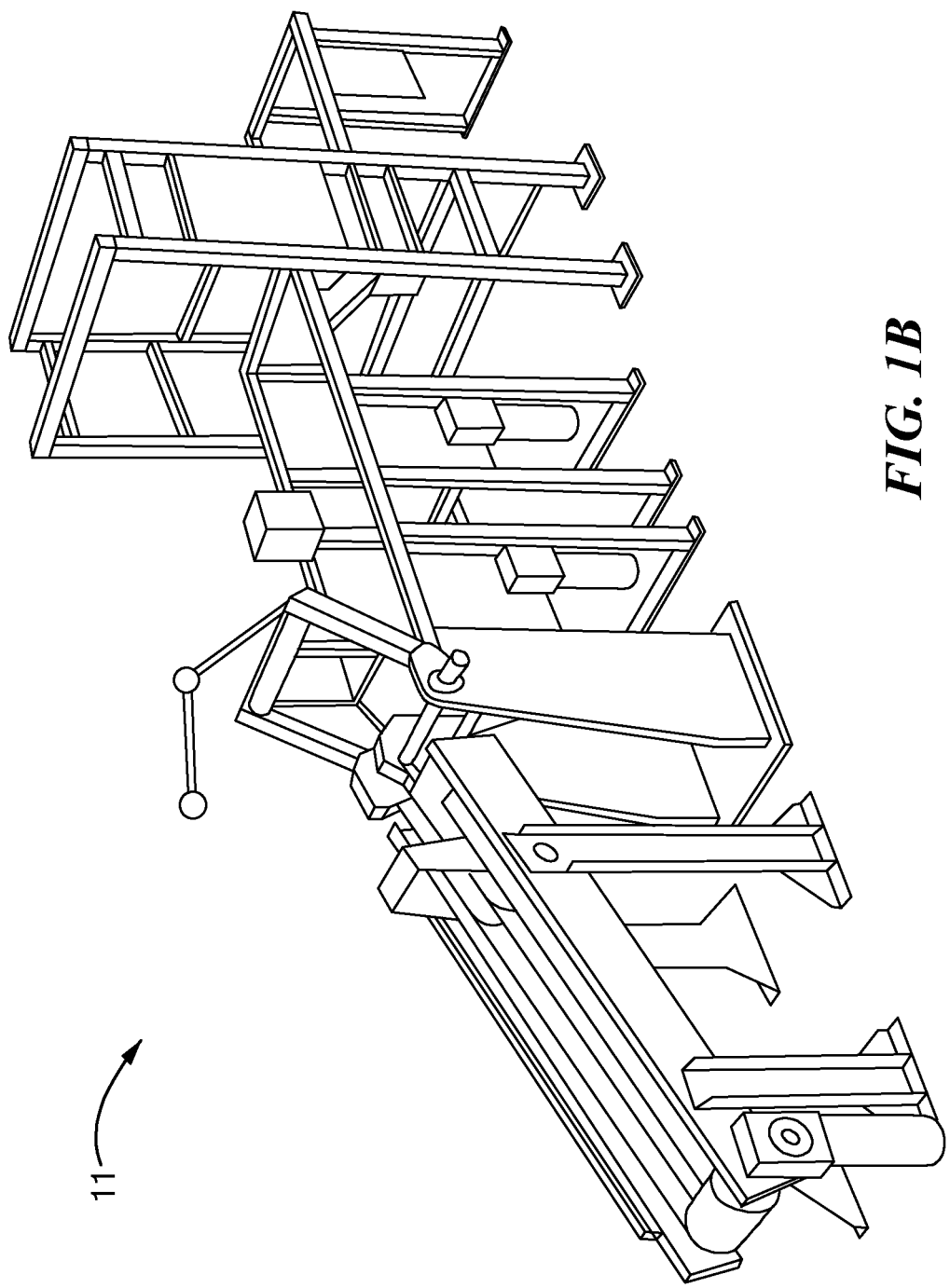

The capital project 10 shown in FIG. 1 is a power plant, which, as known by those skilled in the art, has an enormous number of different components that cooperate to accomplish its function of generating power. For example, among other things, the power plant of this figure has a plurality of large and small buildings, smokestacks, pipes, valves, fuel tanks, ladders, and electrical systems. Indeed, designing, building, and maintaining such a project requires vast amounts of planning and coordination. Without careful planning and coordination, the power plant may never have been built or operated.

To that end, those skilled in the art have developed the prior noted plant design programs/products ("plant design programs") to assist in planning/designing, developing, maintaining, and decommissioning capital projects 10, such as that shown in FIG. 1. As noted above, one such widely used plant design program is known as the SmartPlant® Enterprise product (hereinafter "SmartPlant® product"), distributed by Intergraph, Inc. of Huntsville, Ala. In a manner similar to other such products, the SmartPlant® product has at least the following interrelated functions and components:

3D modeling and visualization,
engineering and schematics,
information management,
procurement, fabrication, and construction,
open integration with other proprietary and open systems.

Moreover, illustrative embodiments of the invention may also be applied to less complex projects of a smaller scale, in addition to large scale capital projects. For example, the subject matter described herein may be applied to manufacturing systems, such as that system 11 displayed in FIG. 1B. Such projects may be developed in programs such as Solidworks, provided by Dassault Systèmes SolidWorks Corporation of Waltham, Mass., or NX Software, provided by Siemens PLM Software of Plano, Tex.

Accordingly, the method of FIG. 2 begins by displaying, on a screen of a computing device (e.g., a smartphone or tablet), a view plane of a three-dimensional model (step 201). For example, the three-dimensional model may represent a power plant during a certain phase of construction. As such, the view plane may show at least one visible element that at least partially visually obstructs at least one other element of the three-dimensional model.

Figure 3:
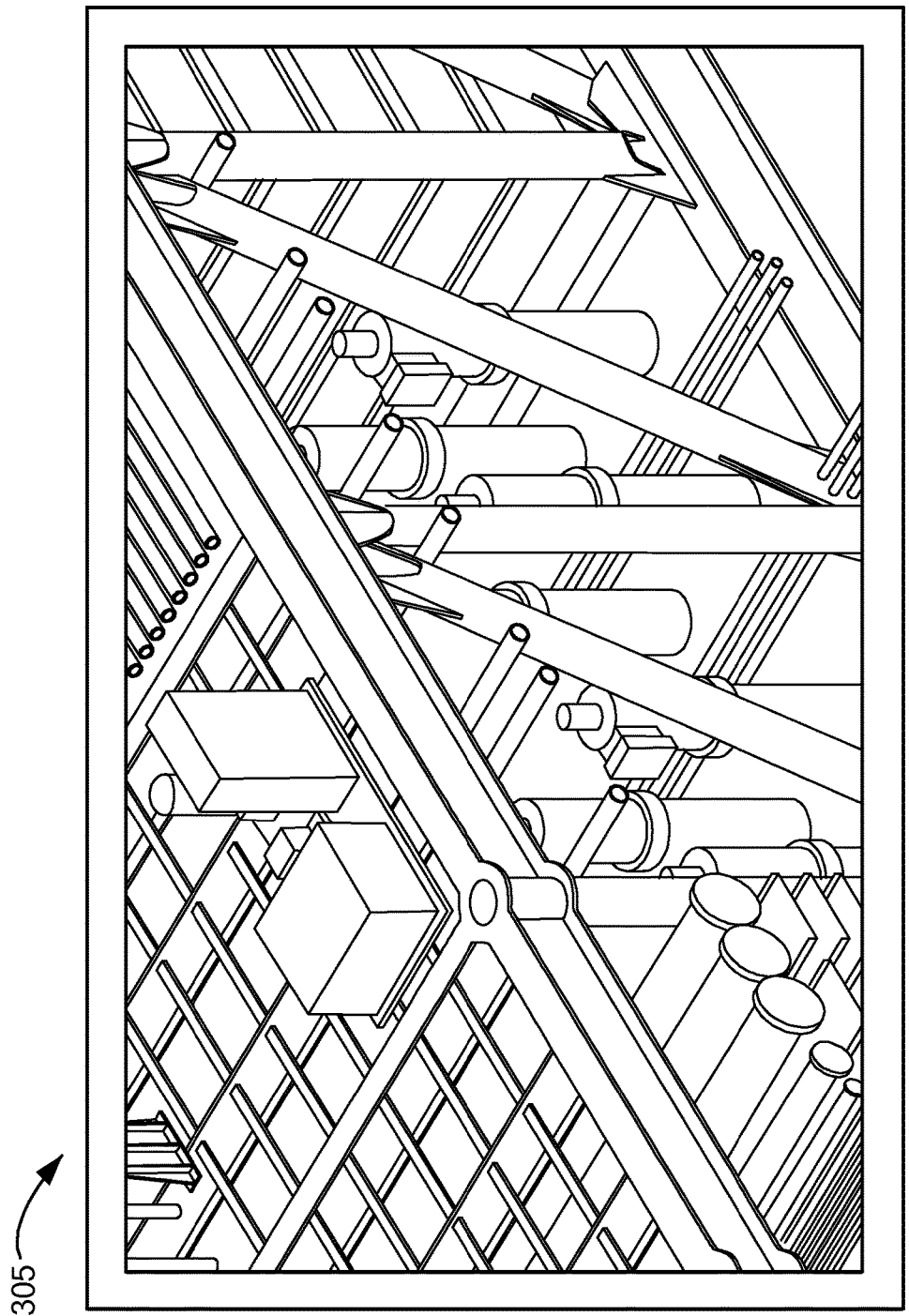
FIG. 3 depicts an exemplary view plane of a 3D model.
Figure 4:
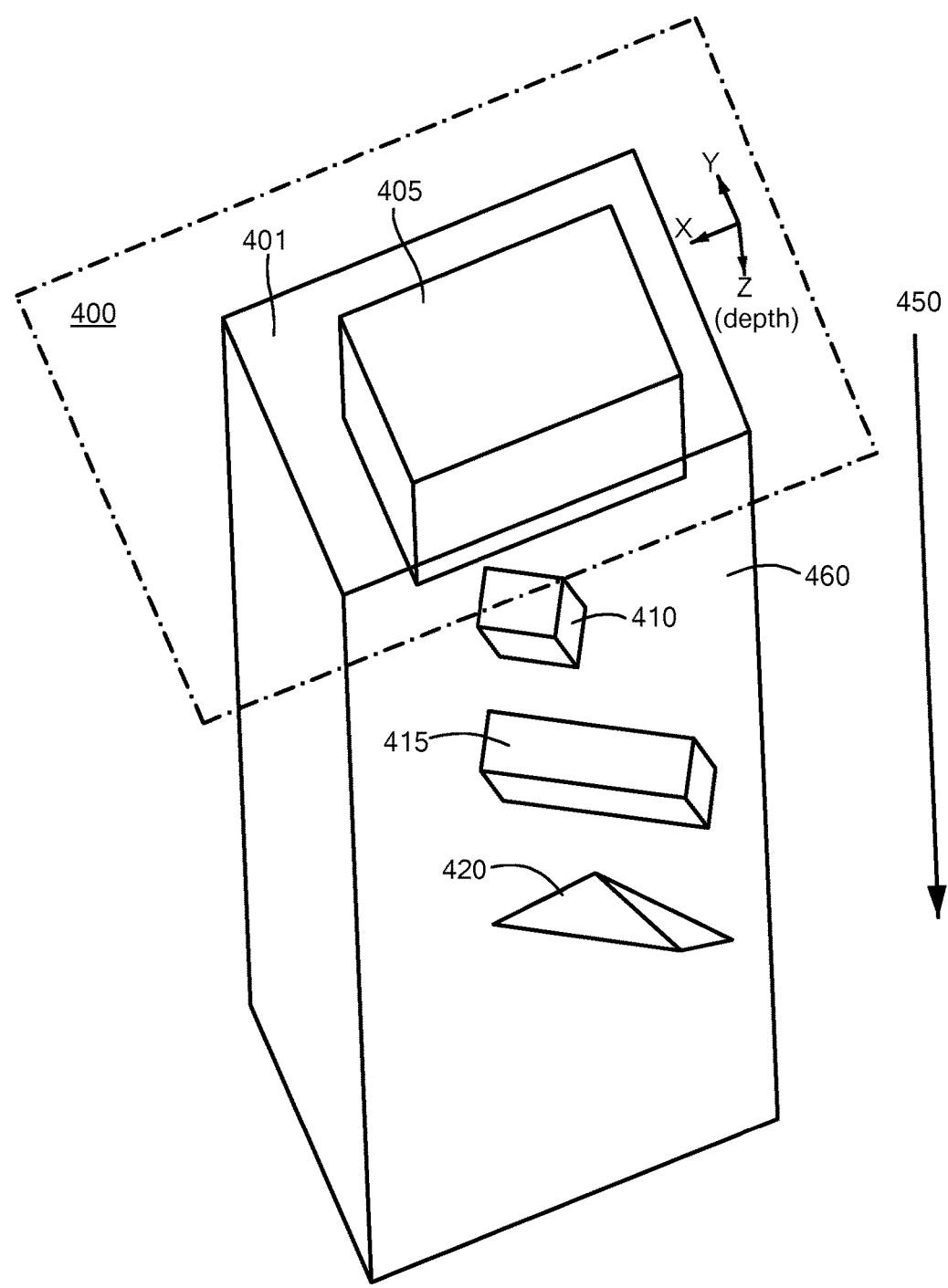
FIG. 4 is a schematic diagram demonstrating how one element of a 3D model may visually obstruct other elements of the model.
Figure 5:
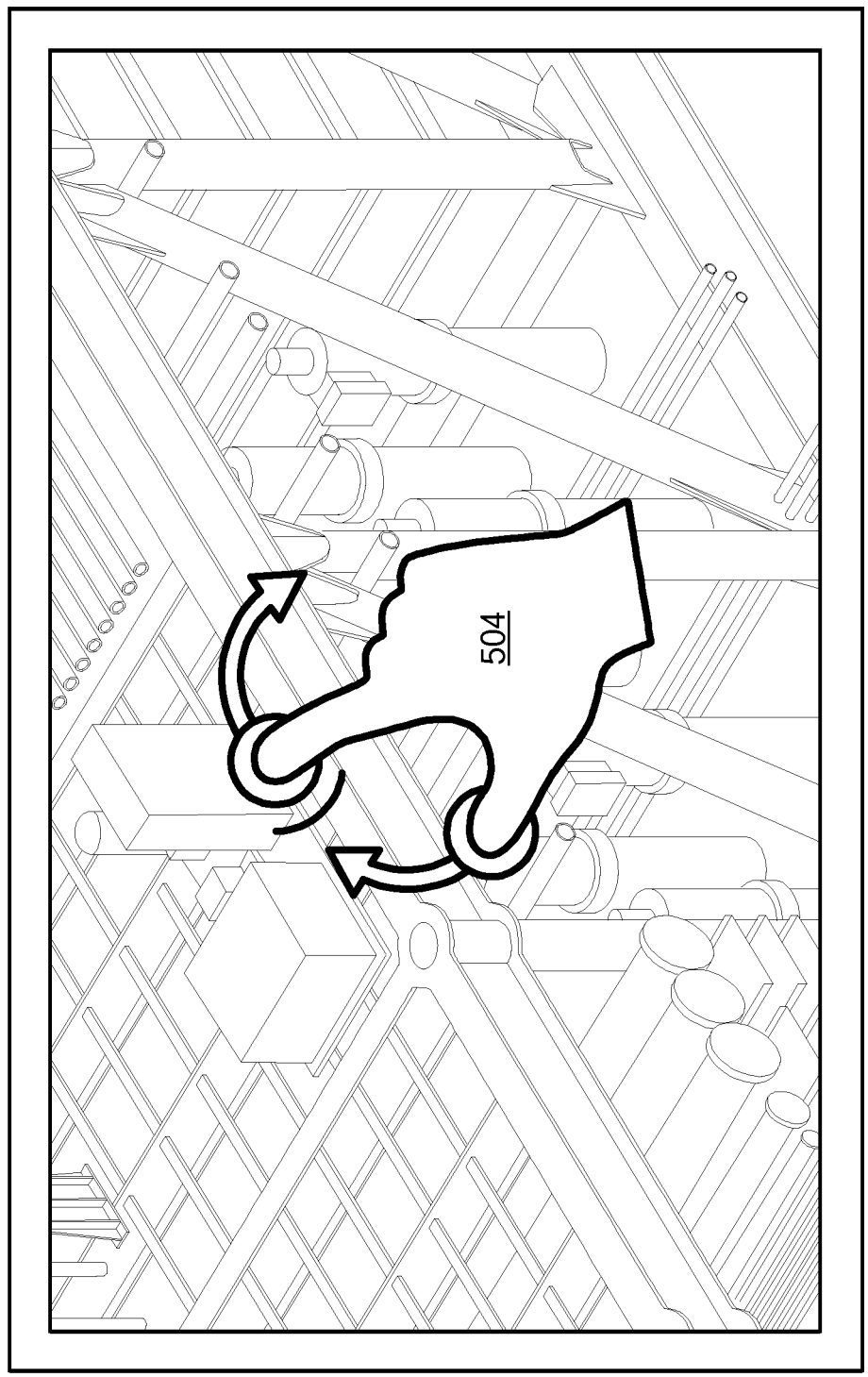
FIG. 5 depicts an exemplary gesture for invoking a function to access visually obscured elements of the exemplary 3D model of FIG. 4.

As an example, FIG. 3 shows a view plane 305 of a 3D model that illustrative embodiments of the invention may use. To produce a view plane, such as that in FIG. 3, the user manipulates the view of the 3D model in a conventional manner by panning, tilting, zooming, rotating, or any combination thereof. This figure shows how various elements are visible in this given view plane. However, these visible elements may visually obscure other elements of the 3D model. For example, FIG. 4 illustrates elements 405, 410, 415, and 420 in a 3D model. Although the elements are all visible in this figure, if the 3D model were viewed from the view plane 400, element 405 would visually obscure element 410, element 410 would at least partially obscure element 415, and so on.

The user may apply an input to invoke a function for accessing visually obscured elements. For example, the user may apply a one or two-finger gesture 404 to a touchscreen by rotating his or her fingers along an arc in a clockwise motion, as depicted in FIG. 4. However, the user may produce another type of input, such as a triple tap or a single-finger swirling motion.

Figure 6:
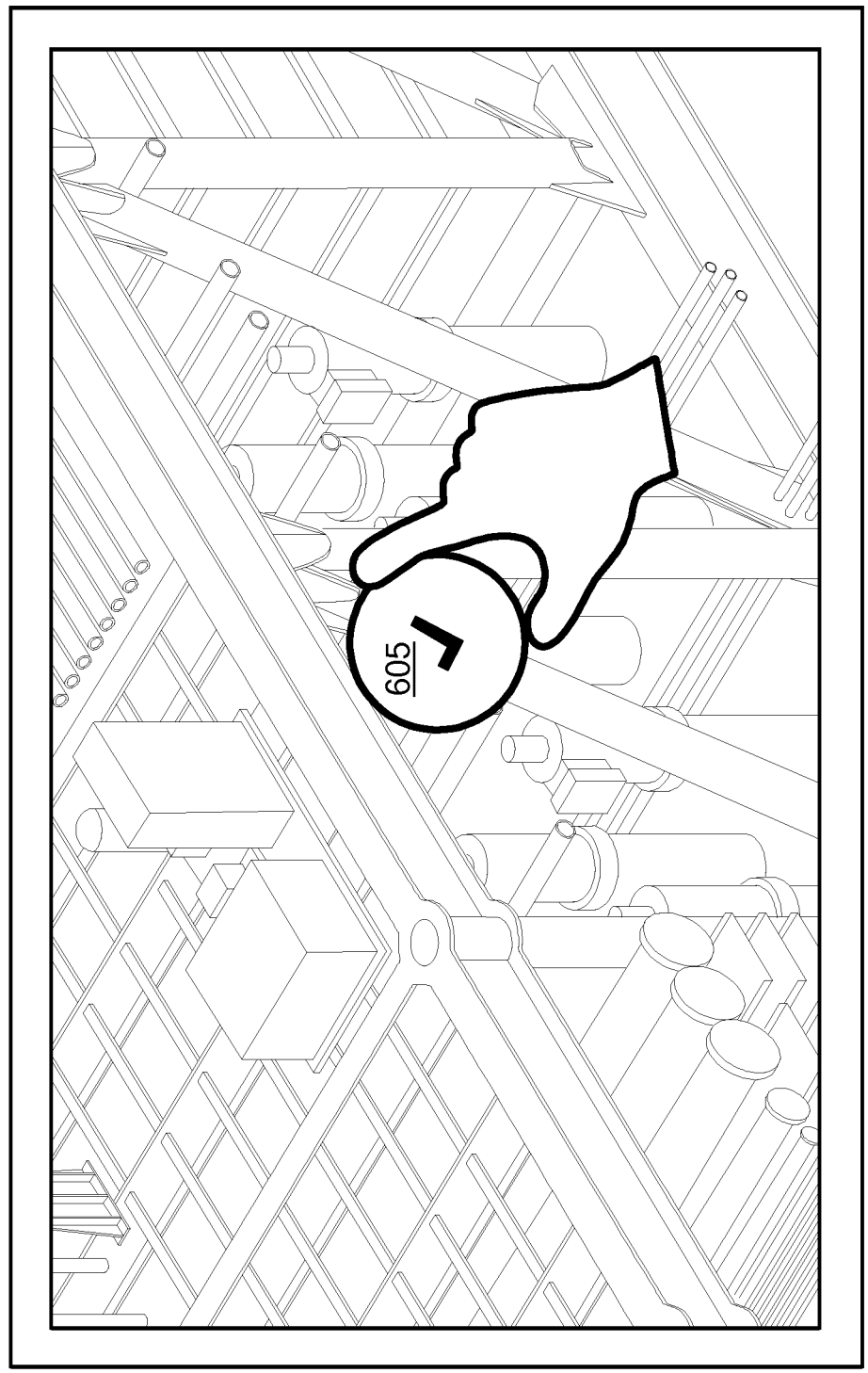
FIG. 6 depicts an exemplary region used to define the portion of the 3D model for investigation.

In response to this input, the system displays a region 605, such as the circle in FIG. 6. The region 605 circumscribes at least one visible element of the three-dimensional model. The user manipulates the region 605, thereby defining the region on the screen to the system (step 205). By resizing and/or locating the region 605 over elements of interest, the user can effectively select a portion of the 3D model for further investigation.

Although the region 605 depicted in FIG. 6 is a circle, the region 605 may be in the form of a polygon with any number of sides (e.g., a triangle, rectangle, or hexagon), or the user may change the boundaries of the region 605 to another desired form factor. In some embodiments, irregularly shaped regions 605 may also be used. Furthermore, the region 605 may be a single point selected by the user. Accordingly, discussion of specific regions 605 is not intended to limit various embodiments of the invention.

In response to subsequent user inputs corresponding to instructions to access visually obscured elements, the system superimposes a visual representation of visually obscured element(s) over the view plane (step 210). In particular, the system identifies one or more visually obscured element(s) of interest based on the region 605, among other things. For example, after the system receives an instruction to access a visually obscured element (described in more detail below), the system may store a vector that is orthogonal to the view plane of the 3D model, and use this vector and the region 605 to identify visually obscured elements of interest for potential display.

FIG. 4 illustrates an exemplary vector 450 that is orthogonal to the view plane 400, which is aligned with region 401. To determine what to superimpose on the view plane 400, the system may identify every element 405, 410, 415, 420 of the 3D model that at least partially intersects the volume 460 defined by the region 401. Specifically, that volume 460 is defined by the region 401 in the X and Y directions, and by the vector 450 in the Z-direction. Accordingly, all elements within this volume 460 are accessible by the above process regardless of whether they are visible, partly obscured, or fully obscured by one or more elements. In this example, the elements 405, 410, 415, 420 all are within the volume 460 and thus, may be displayed by step 210. In some embodiments, the system also will locate elements that are only partly within this volume 460.

Additionally, the initial instruction to access a visually obscured element may prompt the system to apply further access instructions solely to the elements in this volume 460. For example, as the system superimposes additional representations of visually obscured elements from this volume 460, the user may wish to explore one particular element further. The user may change the view plane 400 by rotating and zooming in on the 3D model so that the previously obscured element is visible. Changing the view plane 400 consequently changes the orthogonal vector 450 and location of the region 401, but the user may not have concluded his or her investigation of the elements contained within volume 460. Thus, in response to the initial instruction, the system may continue making the elements in volume 460 the focus of the user's investigation, even if the user changes the view plane to gather further information about elements of interest and their neighboring elements.

Figure 7:
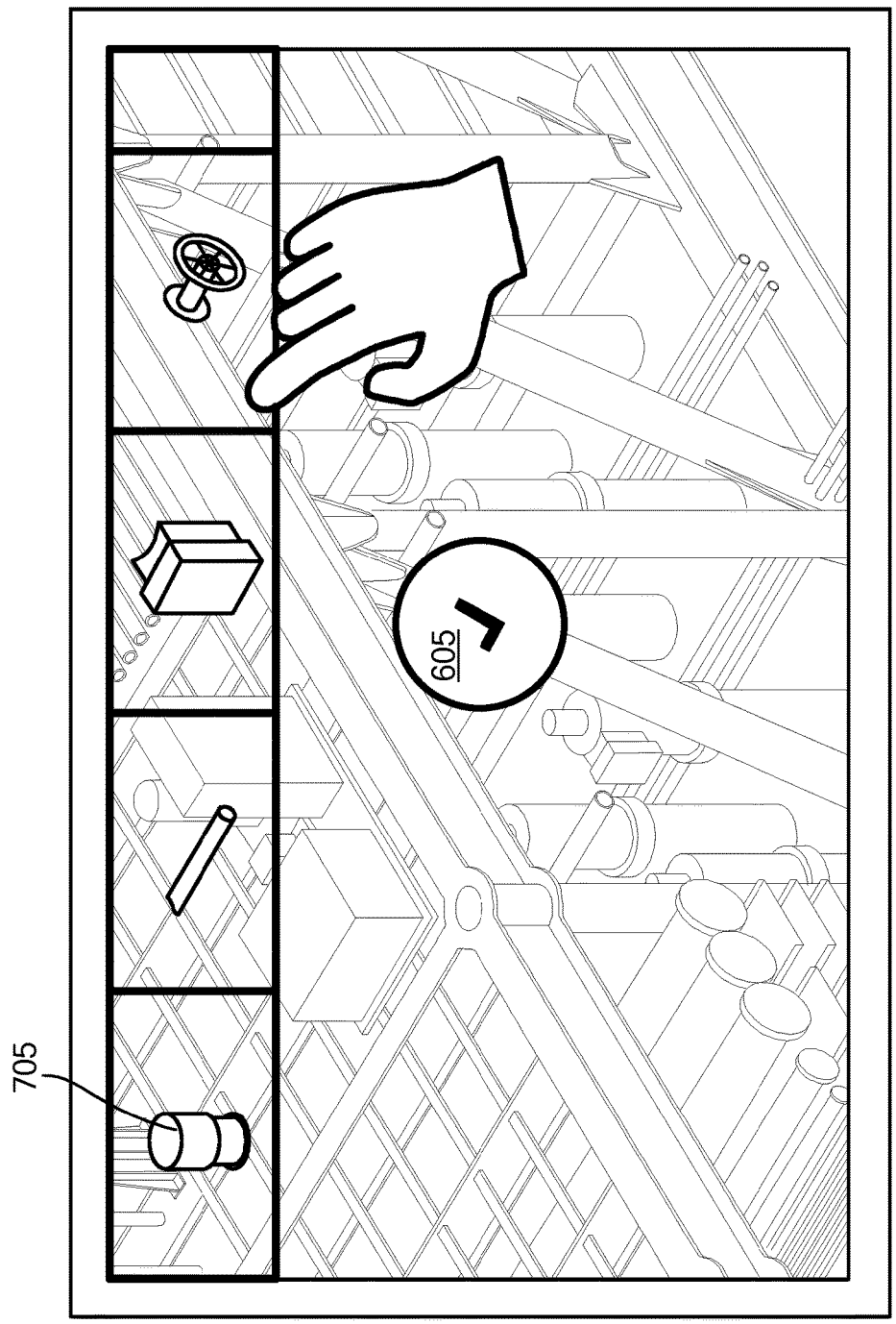
FIG. 7 depicts an exemplary linear configuration of superimposed representations of visually obscured elements of a 3D model.

After identifying one or more elements that intersect with the volume 460, the system uses the subsequent input to determine which of these elements to display or superimpose on the view plane 400. In one example, the subsequent input may be an instruction to display all elements 410, 415, 420 within the volume 460. Thus, if this subsequent input were applied to the 3D model of FIG. 4, the system would simultaneously or serially superimpose representations of elements 410, 415, and 420 on the view plane 400, thereby providing the user access to all elements 410, 415, 420 obscured by element 405. In some embodiments, the system would arrange the representations in a linear configuration 705 (e.g., a filmstrip view), as depicted in FIG. 7. However, other arrangements may be used, such as tile layouts, circular configurations, or any other orderings as would be appreciated by one of ordinary skill in the art. Moreover, the visual representation of the element(s) can be in any format and orientation that is identifiable and meaningful to the user. For example, the visual representation can be an exact copy of its representation within the three-dimensional model. Alternatively, the visual representation may include a different shape, lower or higher detail drawing, letters, numbers or other visual indicia.

Figure 8:
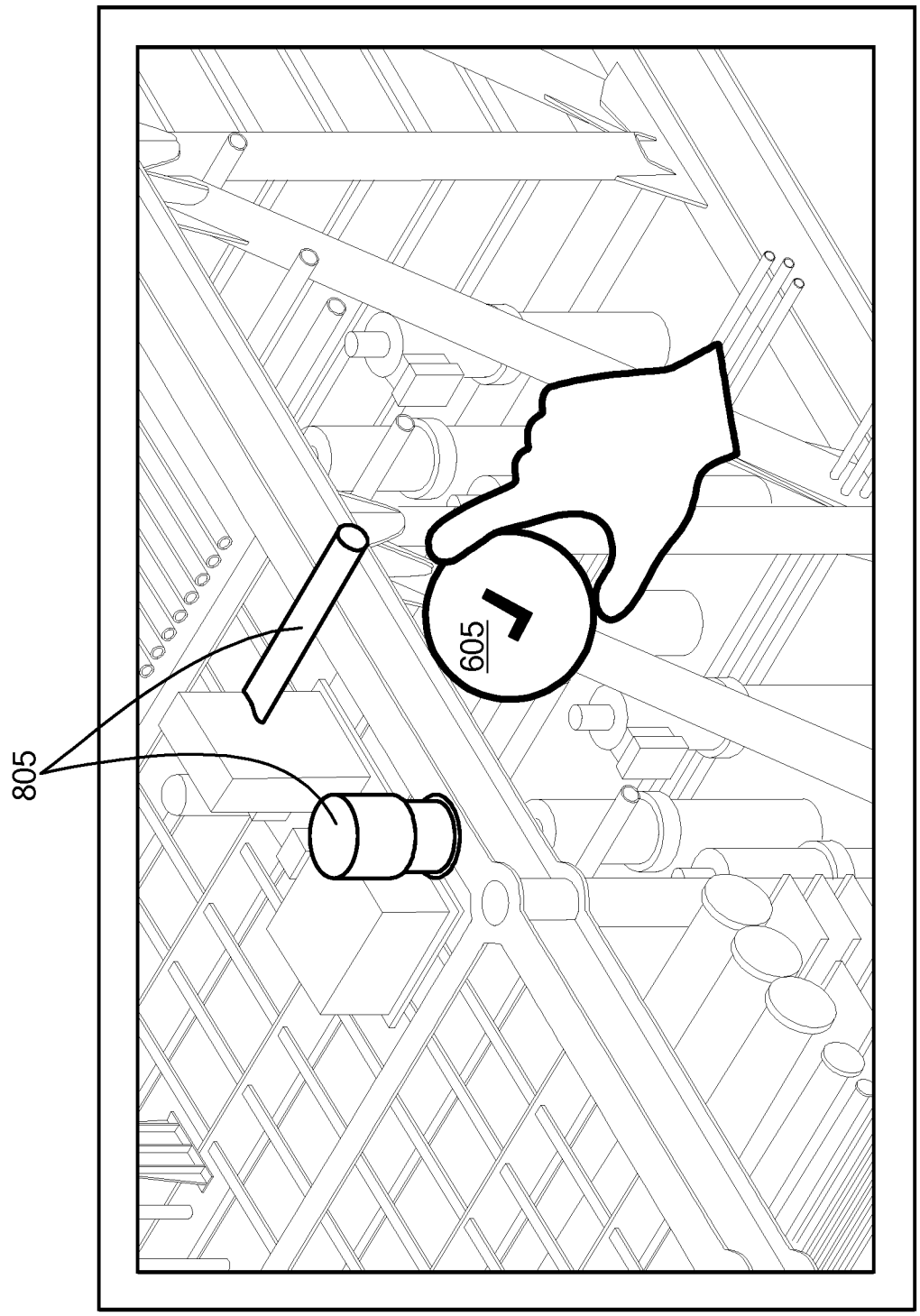
FIG. 8 depicts an exemplary circular configuration of superimposed representations of visually obscured elements of a 3D model.

In another example, the subsequent input may be an instruction to display elements at a prescribed or deeper depth within the volume 460, and/or based on their respective depths within the volume 460 defined by the region 401. Accordingly, if this input were applied to the view of the 3D model of FIG. 4, the system may define the volume 460 to encompass the visible element 405 and the visually obscured elements 410, 415, and 420. The system therefore would first superimpose a representation of element 410 on the view plane 400. As the user continues to apply this input, the system would subsequently superimpose a representation of element 415, followed by a representation of element 420. In some embodiments, the system may store a predetermined layout for the representations, and as the user continues to apply the input, the system may populate each location in the layout with another representation. The layout may be any of the configurations discussed above. For example, the layout may be circular with fixed locations, as depicted in FIG. 8.

Figure 9:
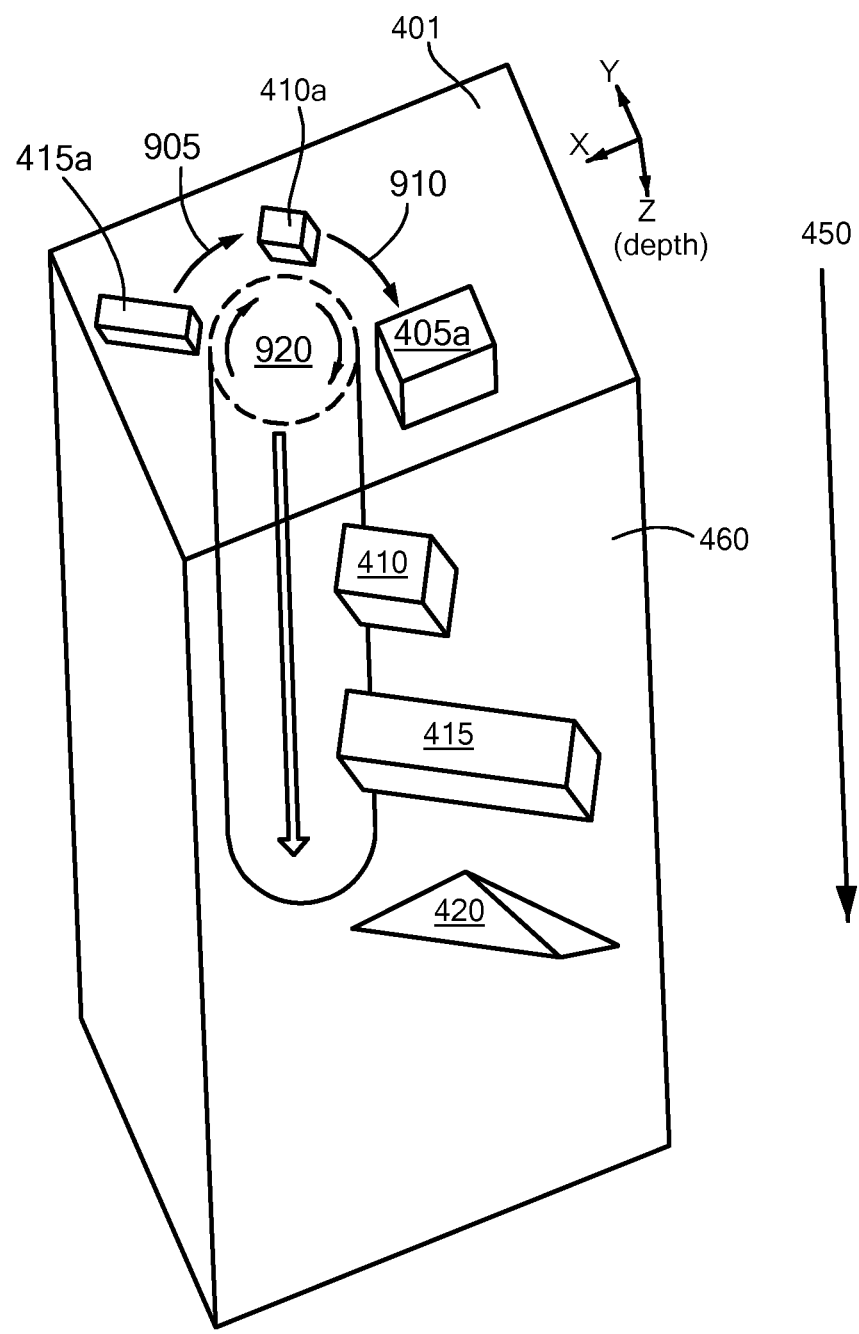
FIG. 9 schematically illustrates the rotation of representations of visually obscured elements around a circular configuration as new representations are added to the display in illustrative embodiments.

In some embodiments, the system may position each successive representation in the same location, moving prior representations of previously superimposed elements to other locations in the layout. For example, FIG. 9 schematically displays the manner in which successive representations of elements in the 3D model of FIG. 4 are rotated in a clockwise manner. The system superimposes the representation 405a of element 405, followed by the representations 410a and 415a of elements 410 and 415, respectively. The most recently displayed representation of an element is positioned where the representation 415a of element 415 is located. As indicated by the arrows 905 and 910, as the system displays other representations, the system moves the earlier displayed representations by one position, in a clockwise direction.

In some examples, the system may be configured to limit the number of simultaneously displayed representations. If the number of representations reaches the limit, the system removes the oldest representation from display, i.e., in a "first in, first out" (FIFO) order.

In a further example, another subsequent input may be an instruction to display elements at a shallower depth within the volume 460. This input may apply solely when the system is configured to limit the number of simultaneously displayed representations. For example, this input may apply when the system no longer displays the representation of a particular element of interest, but the user wishes to return to it. In response to the input, the system removes the most recently displayed representation of an element and re-displays the most recently removed representation of an element, in a "last in, first out" (LIFO) order.

Any of the subsequent inputs corresponding to instructions to display elements at deeper or shallower depths within the volume 460 may be inputs that the user applies continuously, or applies multiple discrete times. For example, the input for an instruction to display elements at a deeper depth within the volume 460 may involve a single-finger gesture, in which the user traces about the circumference of the region 605 in a clockwise motion. In some embodiments, when the user performs the gesture in a continuous manner, the system superimposes another representation of an element deeper within the volume 460 after the duration of the gesture exceeds another threshold period of time. For example, using the volume 460 for the 3D model depicted in FIG. 9, if the threshold period is one second, the system may display the representation 410a of element 410 after the user applies the gesture for one second, and the representation 415a of element 415 after the user applies the gesture for another second. Because applying this gesture continuously may be impractical or awkward for a user, the user may apply the gesture multiple times, and the system may display additional representations after the cumulative duration of the gestures exceeds another threshold. Alternatively, the system may display another representation after each application of the gesture.

The subsequent input for an instruction to display elements at a shallower depth within the volume 460 may be similar to the instruction to display elements at a deeper depth. For example, if the deeper depth instruction requires a gesture rotated in the clockwise direction, the shallower depth instruction may require a gesture rotated in the opposite direction (i.e., counter-clockwise). However, like the gestures noted above, these gestures are merely exemplary; the system may be configured to recognize any type of input for the instructions to display elements at deeper or shallower depths. For example, an input may be a two-finger swirl in a clockwise or counterclockwise motion. Moreover, the inputs need not be user gestures on a touchscreen. The user may provide the input through other input devices, such as a mouse. For example, the user may depress a button on a mouse and move the corresponding cursor in a clockwise motion to instruct the system to display elements at a deeper depth within the volume 460. Alternatively, the user may mount a virtual reality, augmented reality, or mixed reality input device on his or her arm or hand, and use this device to input clockwise motion to the system.

Figure 10:
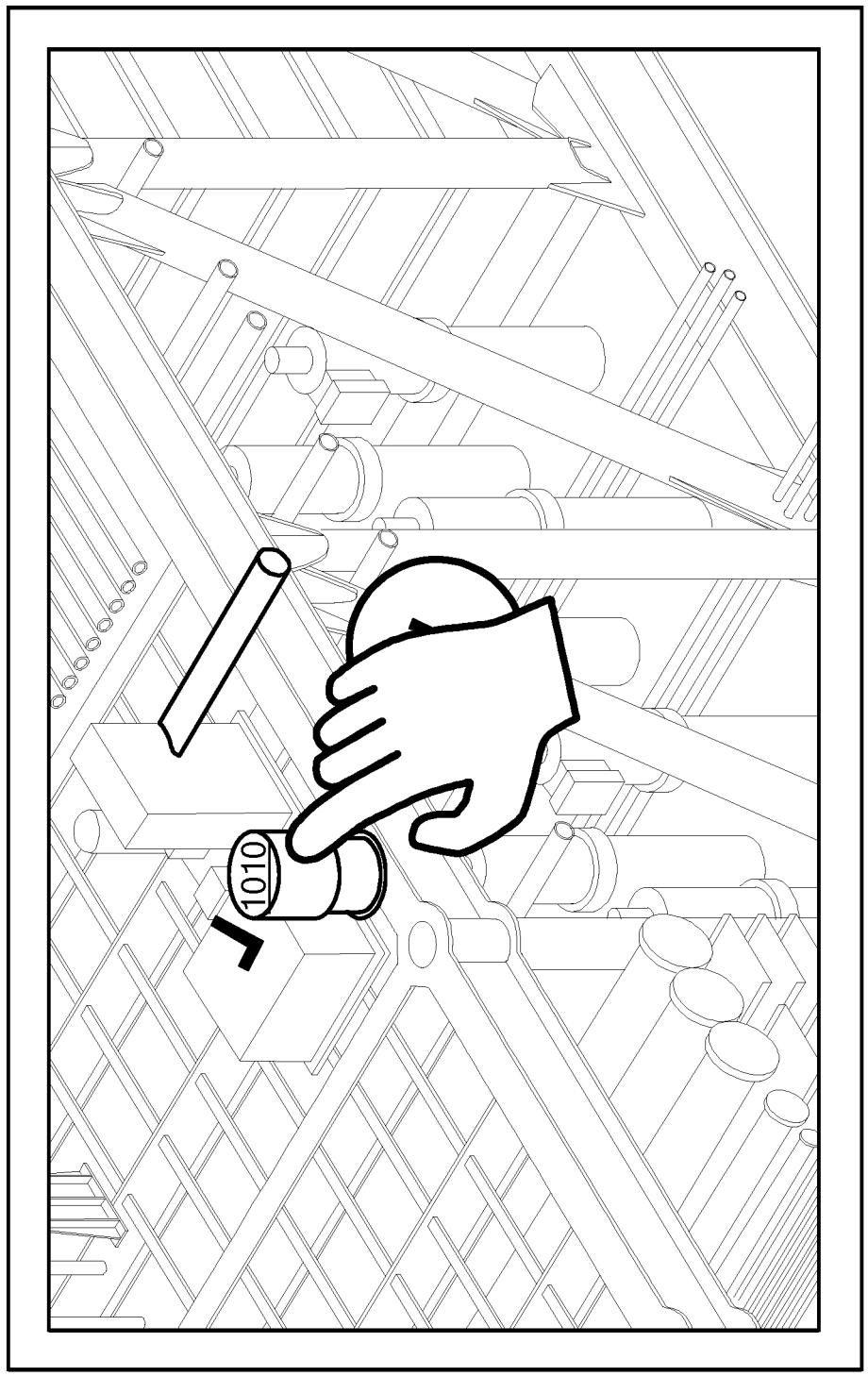
FIG. 10 depicts the selection of a representation of an element in illustrative embodiments of the invention.
Figure 11:
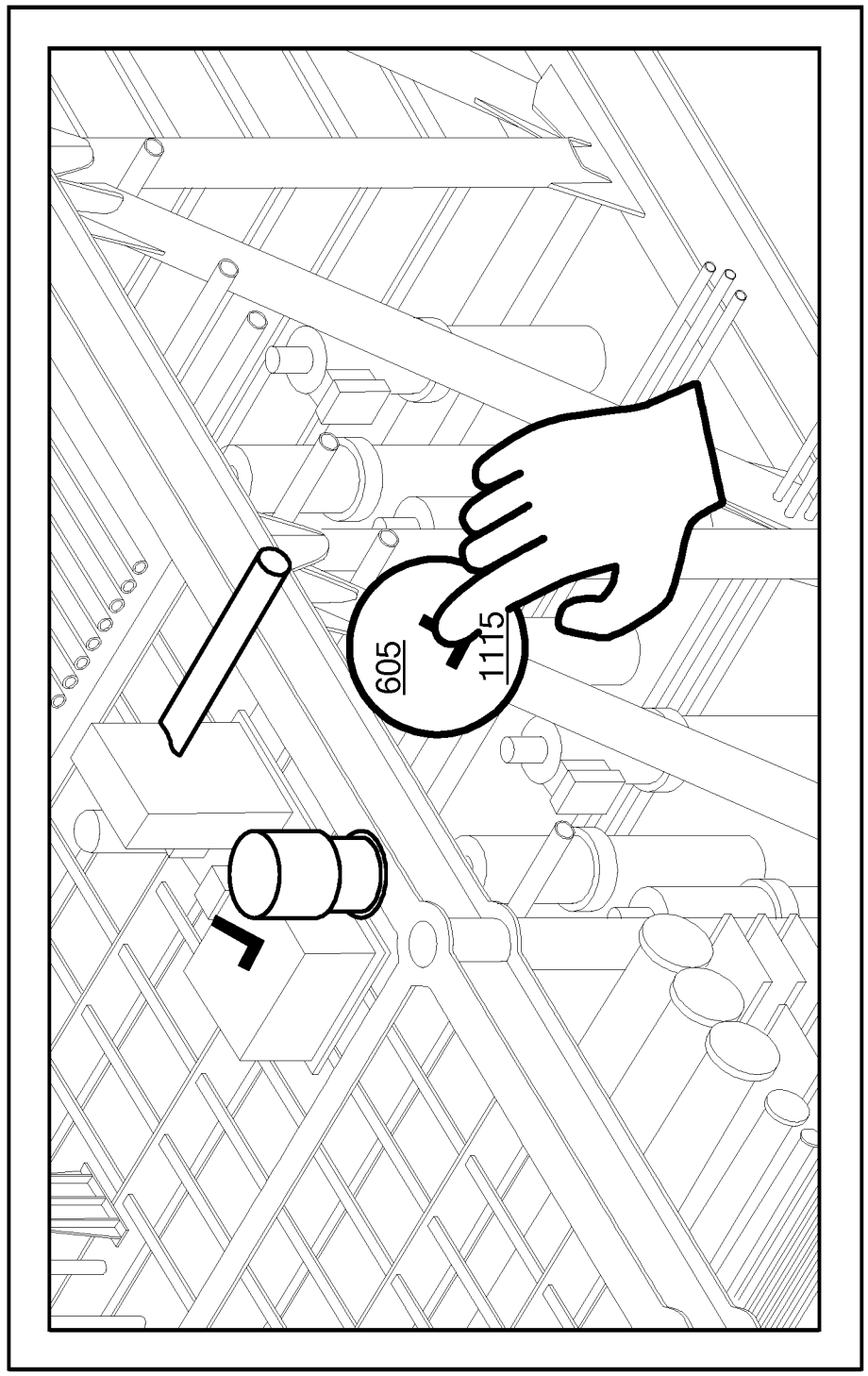
FIG. 11 depicts the confirmation of the selection of the element in FIG. 10 in illustrative embodiments.
Figure 12:
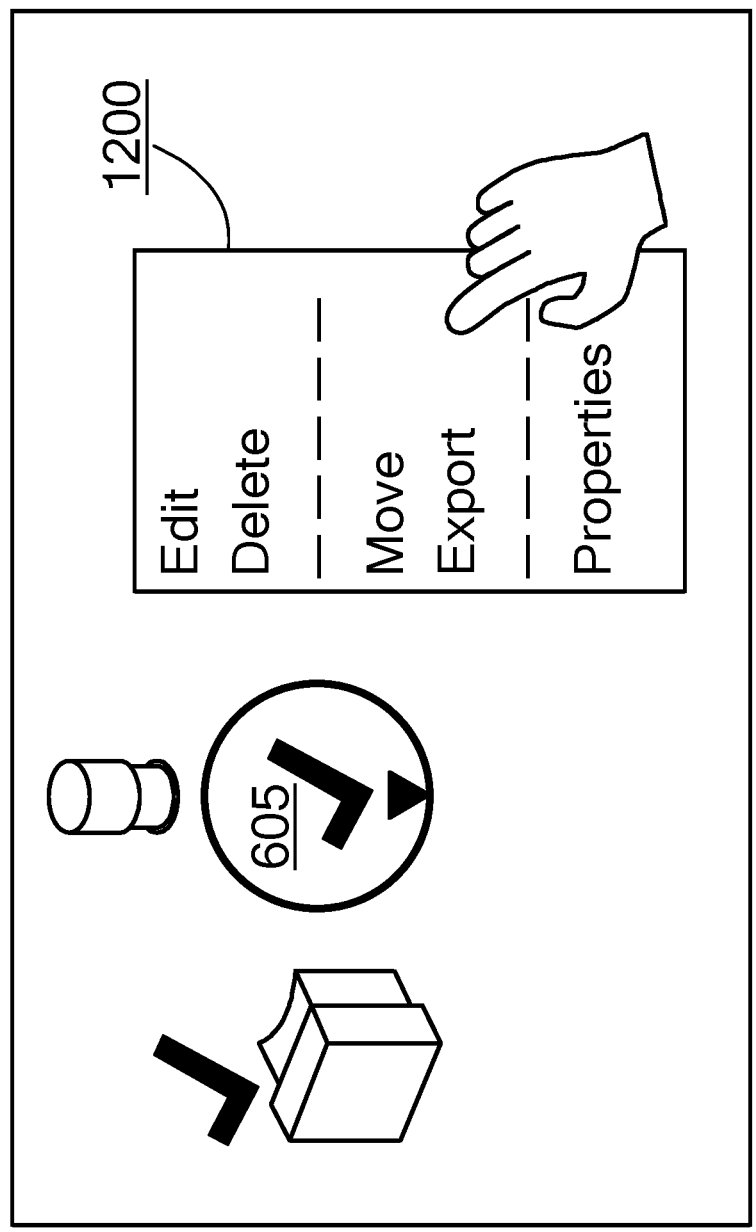
FIG. 12 depicts an exemplary menu of functions that may be applied to a selected element.
Figure 13:
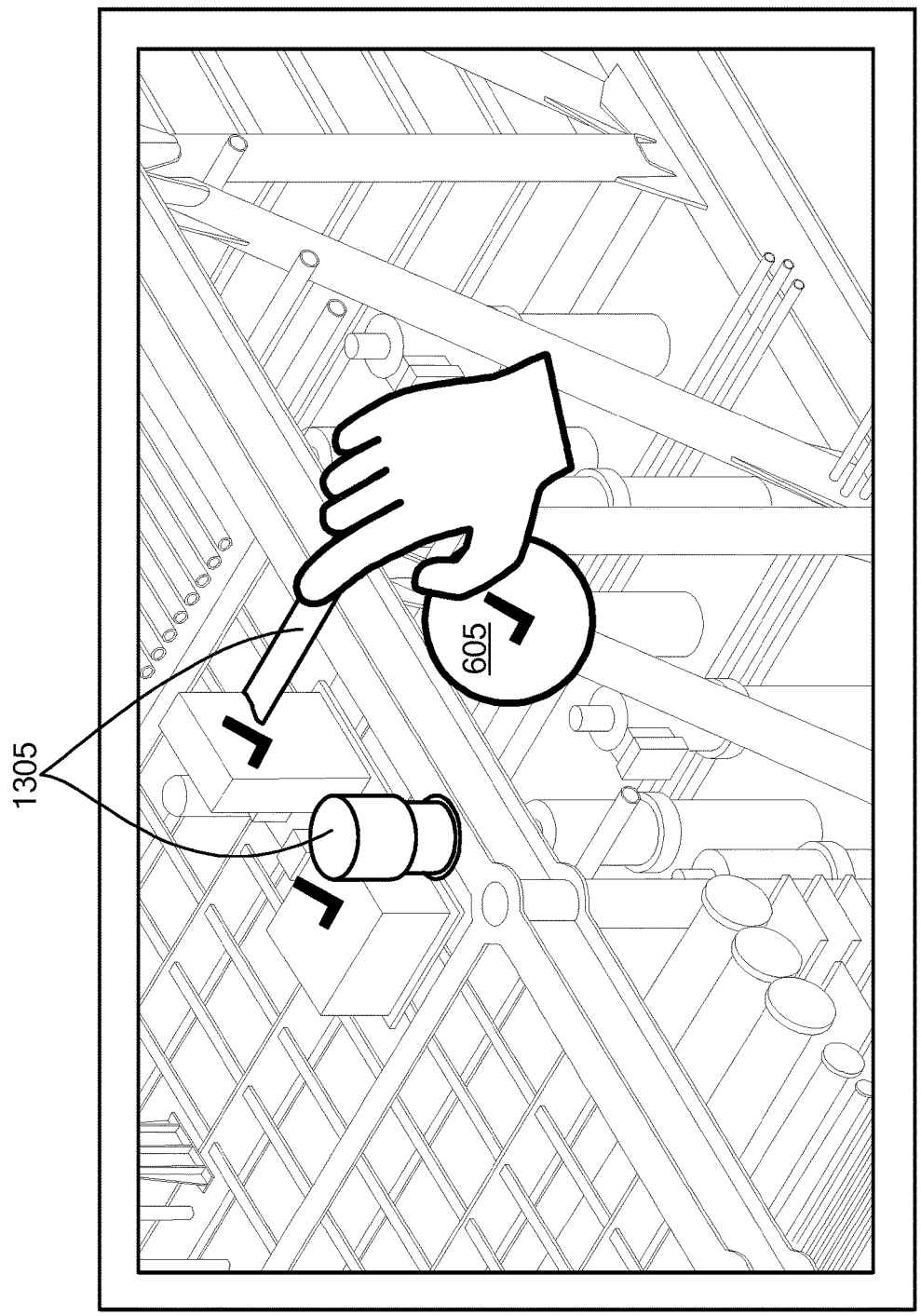
FIGS. 13 and 14 depict the selection of multiple representations of elements in illustrative embodiments.
Figure 14:
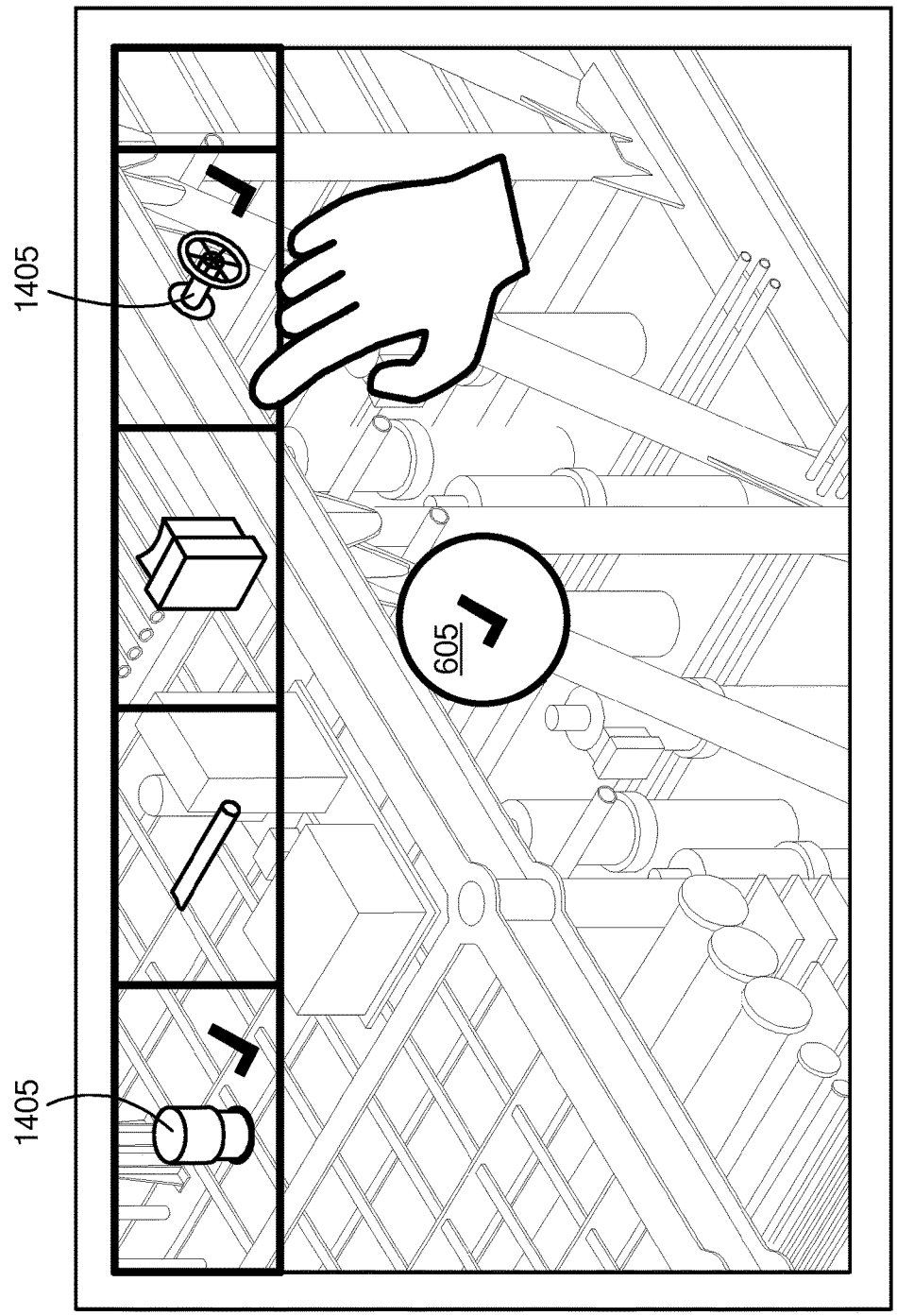

Furthermore, the user may select an element via its superimposed representation to provide further functionality to the system. For example, FIG. 10 depicts a user selection of a representation 1010 of an element, and FIG. 11 depicts a user instruction 1115 confirming the selection of the representation 1010 (in some embodiments, additional confirmation of the selection may be optional). In response to the selection, the system displays a menu of functions available for application to the selected element. An exemplary menu 1200 is depicted in FIG. 12. The user may select one or more of the functions in the menu 1200 to perform any of a variety of functions. For example, the user may select functions to edit the element itself, delete the element from the 3D model, move the element to another position in the 3D model, export the element, or view the properties of the element. Additional functions may rotate the representation of the element in 3D space. Moreover, the user may select multiple elements 1305, 1405, as depicted in FIGS. 13 and 14, and, as suggested in some embodiments, multiple functions from the menu may be simultaneously applied to the selected elements.

In illustrative embodiments, the user may move the region 605 to view elements related to a particular element of interest. For example, after locating and selecting a particular visually obscured element, the user may move the region 605 to view elements to which the selected element is mechanically, electrically, or fluidly coupled. When the user moves the region 605 to another location on the screen, the region 605 and vector 450 orthogonal to the view plane 400 define another volume within the 3D model, which includes other elements. Because the user has selected an element from the original volume 460, the system focuses solely on elements in the new volume that are coupled to the selected element. Consequently, the user may move the region/volume to other locations over the 3D model to track elements that are connected or related to the selected element. In some embodiments, the user may invoke a menu for the selected element to specify the type of coupling. Then, as the user shifts the region 605 around the screen, the system may display representations of different elements coupled to the selected element in the manner specified by the user.

Figure 15:
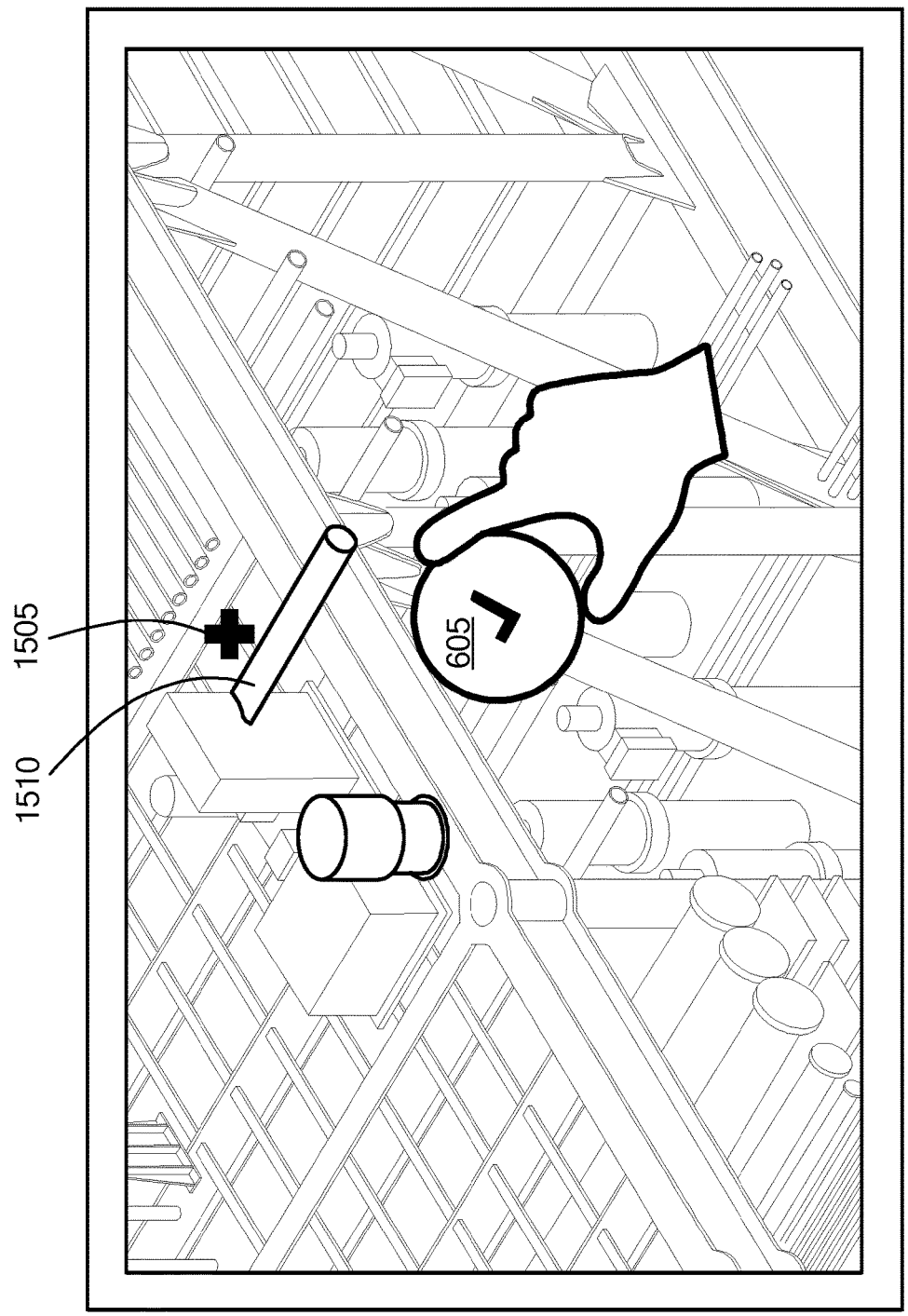
FIG. 15 depicts an exemplary icon that indicates that an element is coupled to other elements or includes composite objects.

In some embodiments, when an element is coupled to other elements or includes composite objects, the system displays an icon near the element's representation to alert the user of this relationship. FIG. 15, for example, shows an icon 1505 related to a pipe 1510. By informing the user of the elements' features, the user may navigate the 3D model more effectively. In some embodiments, the icon 1505 merely puts the user on notice that an element may have noteworthy features.

In other embodiments, the user may select the icon 1505 to instruct the system to display elements that are coupled to the pipe 1510. Subsequently, when the user moves the region 605 around the screen, the system displays representations of elements in the corresponding volumes 460 that are coupled to the pipe 1510. Alternatively, in response to user selection of the icon 1505, the system superimposes representations of elements that are both fluidly coupled to and in physical contact with the pipe 1510. By selecting one of these elements, the user effectively selects a fluidic path to investigate. In response to further user inputs (e.g., either the same input used for displaying elements at a deeper depth within the 3D model, or another input, if so desired), the system identifies elements that are coupled to the selected element and superimposes them on the view plane 400. In this manner, the system may enable the user to follow electrical connections, piping connections, or other types of connections, through a portion of the 3D model.

If the icon 1505 indicates that the element includes smaller composite objects, selecting the icon 1505 may cause the system to superimpose representations of each composite object on the view plane 400. In some embodiments, the user may provide an input so that the system superimposes representations of elements in order of their depth within the volume 460.

In a similar manner, various embodiments of the invention permit the user to redefine the portion of the 3D model to investigate. As previously mentioned, when the user applies the initial instruction to access visually obscured elements, the system may identify 1) every element of the 3D model that at least partially intersects with the volume 460 defined by the region 605, 2) the location of the region 605 on the screen, and 3) the vector 450 that is orthogonal to the view plane 400 of the 3D model. In some embodiments, if the user has not changed the orientation, position, or size of the view plane 400, then the act of moving the region 605 to another location on the screen redefines the volume 460 based on the new screen location, the region, and the stored vector. As such, this new volume 460, as noted above, can identify new partially intersecting elements in that volume 460.

Figure 16:
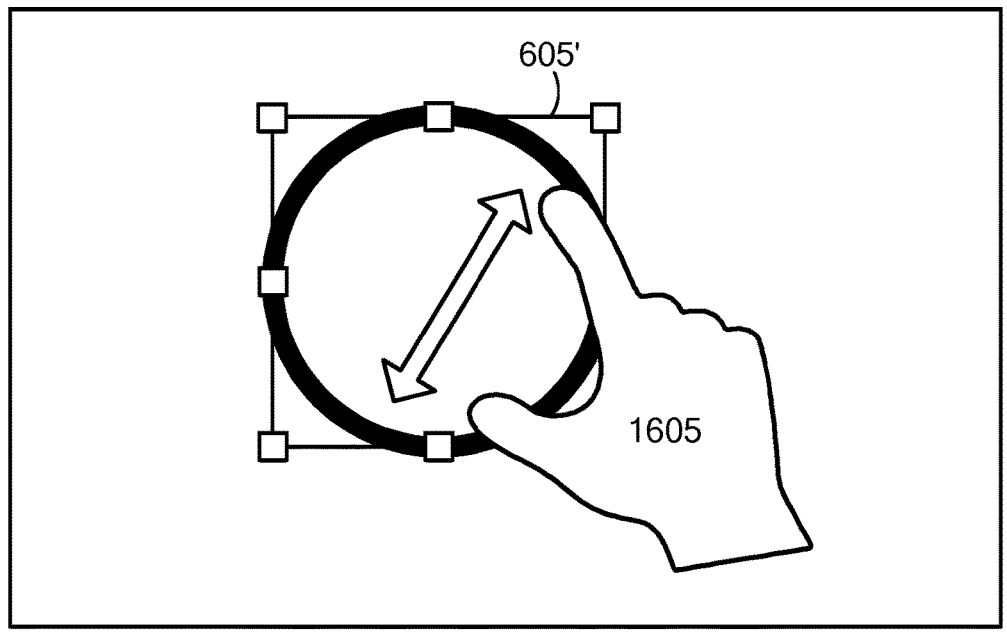
FIG. 16 depict the resizing of a region used to define the portion of the 3D model for investigation in accordance with illustrative embodiments.

FIG. 16 shows another method of redefining the portion of the 3D model, in which the user resizes the region 605. The user may apply a gesture 1605 to enlarge the size of the region 605, although other gestures may be used to decrease its size. Alternatively, the user may redefine the region by inputting different boundaries, such as changing the shape of the region.

Furthermore, the user may instruct the system to reset all parameters for investigating visually obscured elements of the 3D model (the system may be configured to recognize any given input as this instruction). In response, the system may delete any form factors or locations for the region 605, as well as any vectors 450 that were stored when the user previously defined regions 605 with respect to a view plane 400. The user may change the view plane 400, in any manner described herein or as would be evident to one of ordinary skill in the art, to observe the 3D model from other perspectives. Accordingly, when the user next defines another region 605 for investigating visually obscured elements of the 3D model, the system once again stores the vector 450 orthogonal to the current view plane 400 and uses the vector 450 to define the volume 460 of the 3D model to investigate.

In some embodiments, the system and method may be conceptualized as boring an auger into the 3D model, beginning from the region 605 defined by the user and continuing in a direction aligned with the vector 450, which is orthogonal to the view plane 400. Thus, these embodiments are conceptualized to bore a core 920 through the model, as depicted in FIG. 9. As the boring penetrates the 3D model, the system displays representations of each element in the order that the conceptualized auger encounters the elements. In a similar manner, the region 605 may be construed to be a graphical knob for the user to manipulate, to control the display of visually obscured elements. For example, the user may use a gesture to turn the knob in one direction for the system to bore deeper into the core 920, and to turn the knob in the opposite direction to retract the core 920.

Figure 17:
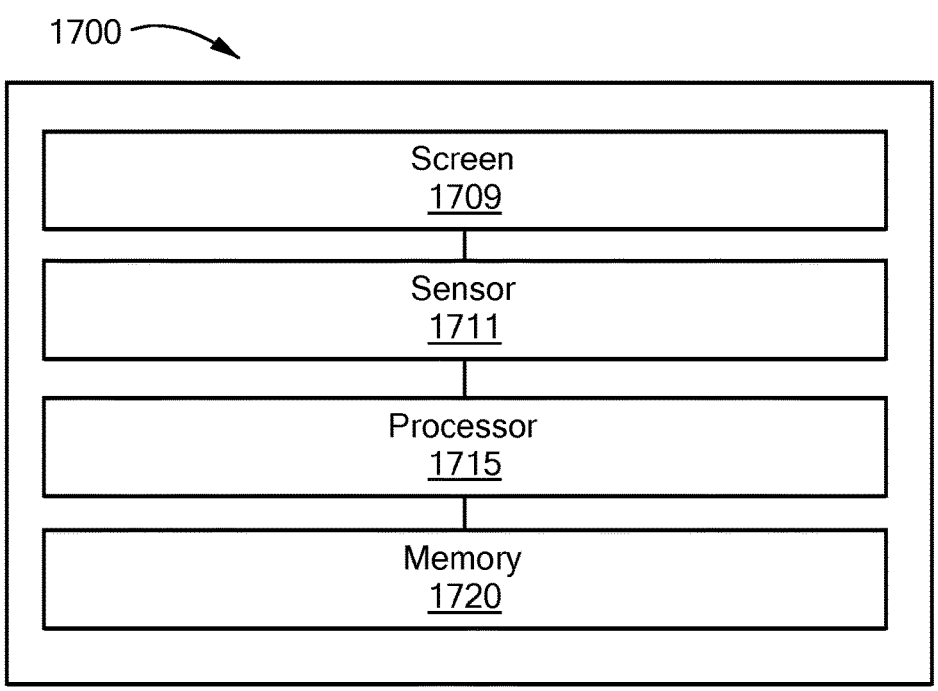
FIGS. 17 and 18 depict exemplary devices for displaying the view planes of the 3D model and representations of visually obscured elements.

Various embodiments of the system may be implemented on haptic computing devices. FIG. 17 shows an exemplary haptic computing device 1700 that may implement various embodiments. The haptic computing device 1700 includes a touchscreen having a screen 1709 coupled to a sensor 1711. As known by those in the art, the sensor 1711 responds to pressure or other contact applied to portions of the screen 1709, and sends signals corresponding to the locations on the screen 1709 to a processor 1715. While executing instructions loaded by memory 1720, the processor 1715 interprets the signals to determine the instructions corresponding to the touch inputs. The haptic devices may be mobile computing devices, such as smartphones or tablets. Alternatively, the haptic devices may be large format devices, such as the Surface Hub, manufactured by Microsoft Corporation of Redmond, Wash.

Figure 18:
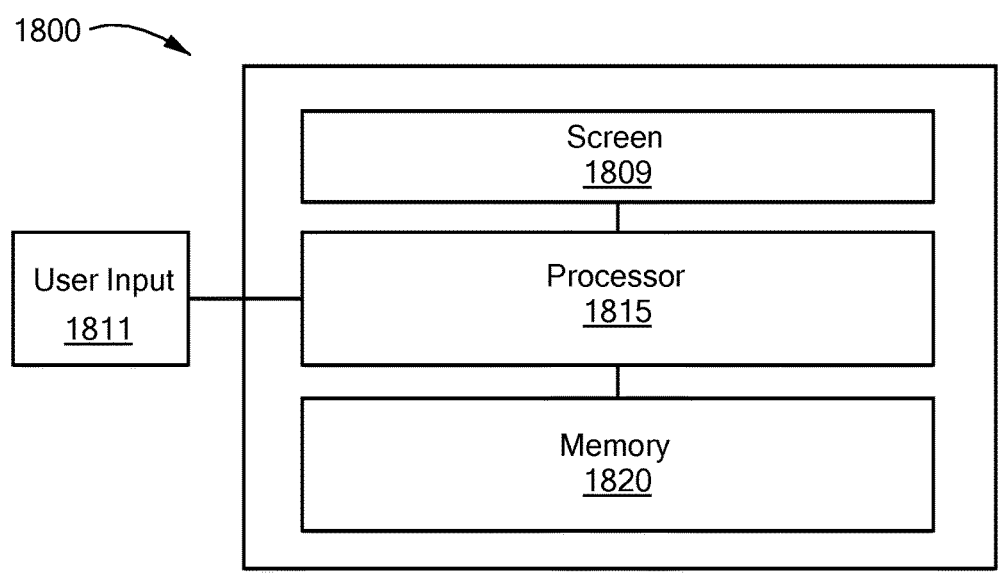

However, other embodiments may also be implemented on non-haptic computing devices, such as the device 1800 depicted in FIG. 18. This computing device 1800 includes a user input device 1811, such as a mouse, keyboard, optical device, or any other input device as would be appreciated by one of ordinary skill in the art. The user controls the user input device 1811 to move a corresponding cursor on a screen 1809, and the user may thus input instructions for a processor 1815 to interpret.

Of course, as noted above, an application produces three-dimensional models to implement various embodiments. This application may either execute locally on a local computing device, or remotely, such as on a server or other remote device. In the former case, the local computing device (e.g., a mobile device) loads the three-dimensional model, receives the user input, and processes the three-dimensional model accordingly. In the latter case, the local computing device may effectively serve as a thin client for the remote device. The local computing device receives user instructions and transmits them for processing by the remote device. The remote device loads and operates upon the 3D model, and sends image data for display on the local computing device.

Various embodiments of the invention may be implemented at least in part in any conventional computer programming language. For example, some embodiments may be implemented in a procedural programming language (e.g., "C"), or in an object oriented programming language (e.g., "C++"). Other embodiments of the invention may be implemented as a pre-configured, stand-along hardware element and/or as preprogrammed hardware elements (e.g., application specific integrated circuits, FPGAs, and digital signal processors), or other related components.

In an alternative embodiment, the disclosed apparatus and methods (e.g., see the flow chart described above) may be implemented as a computer program product for use with a computer system. Such implementation may include a series of computer instructions fixed either on a tangible, non-transitory medium, such as a computer readable medium (e.g., a diskette, CD-ROM, ROM, or fixed disk). The series of computer instructions can embody all or part of the functionality previously described herein with respect to the system.

Those skilled in the art should appreciate that such computer instructions can be written in a number of programming languages for use with many computer architectures or operating systems. Furthermore, such instructions may be stored in any memory device, such as semiconductor, magnetic, optical or other memory devices, and may be transmitted using any communications technology, such as optical, infrared, microwave, or other transmission technologies.

Among other ways, such a computer program product may be distributed as a removable medium with accompanying printed or electronic documentation (e.g., shrink wrapped software), preloaded with a computer system (e.g., on system ROM or fixed disk), or distributed from a server or electronic bulletin board over the network (e.g., the Internet or World Wide Web). In fact, some embodiments may be implemented in a software-as-a-service model ("SAAS") or cloud computing model. Of course, some embodiments of the invention may be implemented as a combination of both software (e.g., a computer program product) and hardware. Still other embodiments of the invention are implemented as entirely hardware, or entirely software.

The embodiments of the invention described above are intended to be merely exemplary; numerous variations and modifications will be apparent to those skilled in the art. All such variations and modifications are intended to be within the scope of the present invention as defined in any appended claims.

What is claimed is:

1. A mobile computing device configured to provide access to visually obscured elements of a three-dimensional model, the mobile computing device comprising:
   a touchscreen configured to receive touch input from a user and to display the three-dimensional model;
   a processor; and
   a memory storing instructions that, when executed by the processor, cause the mobile computing device to:
   receive, on the touchscreen from the user, a first touch input identifying a view plane by which the three-dimensional model is displayed;
   display, on the touchscreen of the computing device, the view plane of the three-dimensional model showing at least one visible element;
   receive, on the touchscreen from the user, a second touch input identifying a region on the touchscreen associated with the at least one visible element in the three-dimensional model;
   display, in response to the second touch input, the region over the at least one visible element on the touchscreen;
   determine, in response to the second touch input, an ordered set of at least partially visually obscured elements of the three-dimensional model based on elements of the three-dimensional model that intersect with a volume based on a vector orthogonal to the view plane identified by the first touch input and the region displayed on the touchscreen;
   receive, on the touchscreen from the user, a third touch input on the displayed region and corresponding to an instruction to display an element that is at least partially visually obscured by the at least one visible element; and
   superimpose over the view plane, in response to the third touch input, a copy of a first element in the ordered set of the at least partially visually obscured elements while simultaneously displaying the at least one visible element in the three-dimensional model.

2. The mobile computing device of claim 1, wherein the processor is configured to execute further instructions to:
   display a representation, over the view plane, of a second element in the ordered set of the at least partially visually obscured elements, wherein the second element is visually obscured by the first element.

3. The mobile computing device of claim 2, wherein the processor is configured to execute further instructions to:
   display the copy of the first element after a duration of the third touch input exceeds a threshold period of time; and
   display the representation of the second element after the duration of the third touch input exceeds a second, successive threshold period of time.

4. The mobile computing device of claim 3, wherein the processor is configured to execute further instructions to:
   receive a fourth touch input on the displayed region on the touchscreen; and
   remove the representation of the second element from display after a duration of the fourth touch input exceeds a fourth threshold period of time.

5. The mobile computing device of claim 3, wherein the processor is configured to execute further instructions to:
   display the copy of the first element and the representation of the second element in a linear or circular configuration.

6. The mobile computing device of claim 1, wherein the first element in the ordered set of the at least partially visually obscured elements is coupled to the at least one visible element via an electrical or piping connection.

7. The mobile computing device of claim 1, wherein the processor is configured to execute further instructions to display an icon that is associated with the first element, the icon indicating that the first element is coupled to at least one other element in the three-dimensional model.

8. The mobile computing device of claim 7, wherein the processor is configured to execute further instructions to:
receive a selection of the icon; and
superimpose, on the view plane, at least one representation of an element coupled to the first element associated with the icon.

9. The mobile computing device of claim 1, wherein the processor is configured to execute further instructions to:
receive an instruction to adjust the region on the touchscreen;
update the ordered set of the at least partially visually obscured elements to include elements of the three-dimensional model that intersect with a volume based on the adjusted region and the vector that is orthogonal to the view plane; and
superimpose a copy of an element in the updated ordered set of the at least partially visually obscured elements over the view plane.

10. The mobile computing device of claim 1, wherein the processor is configured to execute further instructions to:
receive an instruction to adjust a size of the region on the touchscreen;
update the ordered set of the at least partially visually obscured elements to include elements of the three-dimensional model that intersect with a volume based on the adjusted region and the vector that is orthogonal to the view plane; and
superimpose a copy of an element in the updated ordered set of the at least partially visually obscured elements over the view plane.

11. The mobile computing device of claim 1, wherein the processor is configured to execute further instructions to:
receive a selection of the copy of the first element; and
display a menu of functions available for application to the selected first element.

12. The mobile computing device of claim 1, wherein the region is a user-sizable region.

13. A method of providing access to visually obscured elements of a three-dimensional model on a touchscreen of a computing device, the method comprising:
receiving, on the touchscreen from a user, a first touch input identifying a view plane by which the three-dimensional model is displayed;
displaying on the touchscreen of the computing device, the view plane of the three-dimensional model showing at least one visible element;
receiving, on the touchscreen from the user, a second touch input identifying a region on the touchscreen associated with the at least one visible element in the three-dimensional model;
displaying, in response to the second touch input, the region over the at least one visible element on the touchscreen;
determining, in response to the second touch input, an ordered set of at least partially visually obscured elements of the three-dimensional model based on elements of the three-dimensional model that intersect with a volume based on a vector orthogonal to the view plane identified by the first touch input and the region displayed on the touchscreen;
receiving, on the touchscreen from the user, a third touch input on the displayed region and corresponding to an instruction to display an element that is at least partially visually obscured by the at least one visible element; and
superimposing over the view plane, in response to the third touch input, a copy of a first element in the ordered set of the at least partially visually obscured elements while simultaneously displaying the at least one visible element in the three-dimensional model.

14. The method of claim 13, further comprising:
displaying a representation, over the view plane, of a second element in the ordered set of the at least partially visually obscured elements, wherein the second element is visually obscured by the first element.

15. The method of claim 14, wherein displaying the copy of the first element and the representation of the second element comprises:
displaying the copy of the first element after a duration of the third touch input exceeds a threshold period of time; and
displaying the representation of the second element after the duration of the third touch input exceeds a second, successive threshold period of time.

16. The method of claim 15, further comprising:
receiving a fourth touch input at the region on the touchscreen; and
removing the representation of the second element from display after a duration of the fourth input exceeds a fourth threshold period of time.

17. The method of claim 15, wherein superimposing the copy of the first element and the representation of the second element comprises:
displaying the copy of the first element and the representation of the second element in a linear or circular configuration.

18. The method of claim 13, wherein the first element in the ordered set of the at least partially visually obscured elements is coupled to the at least one visible element via an electrical or piping connection.

19. The method of claim 13, further comprising:
displaying an icon that is associated with the first element, the icon indicating that the first element is coupled to at least one other element in the three-dimensional model.

20. The method of claim 19, further comprising:
receiving a selection of the icon; and
superimposing, on the view plane, at least one representation of an element coupled to the first element associated with the icon.

21. The method of claim 13, further comprising:
receiving an instruction to adjust the region on the touchscreen;
updating the ordered set of the at least partially visually obscured elements to include elements of the three-dimensional model that intersect with a volume based on the adjusted region and the vector that is orthogonal to the view plane; and
superimposing a copy of an element in the updated ordered set of the at least partially visually obscured elements over the view plane.

22. The method of claim 13, further comprising:
receiving an instruction to adjust a size of the region on the touchscreen;
updating the ordered set of the at least partially visually obscured elements to include elements of the three-dimensional model that intersect with a volume based on the adjusted region and the vector that is orthogonal to the view plane; and superimposing a copy of an element in the updated ordered set of the at least partially visually obscured elements over the view plane.

23. The method of claim 13, further comprising:
receiving a selection of the copy of the first element; and
displaying a menu of functions available for application to the selected first element.

24. The method of claim 23, wherein the menu of functions comprises any one of viewing properties of the selected first element, editing the selected first element, deleting the selected first element, and displaying elements that are related to the selected first element.

25. The method of claim 24, wherein displaying elements that are related to the selected first element includes displaying electrical connections or piping connections coupled to the selected first element.

26. The method of claim 13, wherein the region is a user-sizable region.

* * * * *